United States Patent
Monroe

(10) Patent No.: US 9,585,267 B2
(45) Date of Patent: *Feb. 28, 2017

(54) AUDIO MIXING CONSOLE CASE

(71) Applicant: Dana Monroe, Portland, OR (US)

(72) Inventor: Dana Monroe, Portland, OR (US)

(*) Notice: Subject to any disclaimer, the term of this patent is extended or adjusted under 35 U.S.C. 154(b) by 161 days.

This patent is subject to a terminal disclaimer.

(21) Appl. No.: 14/316,992

(22) Filed: Jun. 27, 2014

(65) Prior Publication Data
US 2014/0306594 A1 Oct. 16, 2014

Related U.S. Application Data

(63) Continuation of application No. 13/052,794, filed on Mar. 21, 2011, now Pat. No. 8,800,455.

(51) Int. Cl.
A47B 3/00 (2006.01)
H05K 5/02 (2006.01)
B62B 3/00 (2006.01)

(52) U.S. Cl.
CPC ........... *H05K 5/0217* (2013.01); *B62B 3/004* (2013.01); *B62B 2205/20* (2013.01)

(58) Field of Classification Search
CPC .... H05K 5/0217; B62B 3/004; B62B 2205/20
USPC ..... 108/1–10, 39, 11–13, 18, 19, 33–41, 15; 280/79.2; 312/21, 8.1, 8.13–8.15, 27–30, 312/240, 241
See application file for complete search history.

(56) References Cited

U.S. PATENT DOCUMENTS

| | | |
|---|---|---|
| 232,684 A | 9/1880 | Clapp |
| 1,382,393 A | 6/1921 | Smith |
| 2,231,235 A | 11/1938 | Weir |
| 2,505,805 A | 5/1950 | Stein |
| 2,547,754 A | 4/1951 | Herrick |
| 2,672,921 A | 3/1954 | Herrick |
| 2,944,862 A | 7/1960 | Heil |
| 2,974,555 A | 3/1961 | Andersen |
| 3,183,860 A | 5/1965 | Kritske |
| 3,186,780 A | 6/1965 | Schaerf |
| 3,208,409 A | 9/1965 | Gale |
| 3,273,517 A | 9/1966 | Amthor |
| 3,298,478 A | 1/1967 | Soprani |
| 3,353,173 A | 11/1967 | Beilfuss |
| 3,391,241 A | 7/1968 | Andersen |
| 3,643,000 A | 2/1972 | Andersen |

(Continued)

*Primary Examiner* — Daniel J Troy
*Assistant Examiner* — Timothy M Ayres
(74) *Attorney, Agent, or Firm* — Joseph P. Curtin, L.L.C.

(57) ABSTRACT

A case for an audio mixer console comprises first and second frame members, a carrier surface and a releasable latch member. The first and second frame members are spaced apart from each other. A first side of the carrier surface is proximate to the first frame member and a second side of the carrier surface is proximate to the second frame member. The carrier surface is pivotally coupled to the first and second frame sides along a first axis of rotation and moves with respect to the first axis of rotation between a first position and a second position. The carrier surface further comprises a catch member located proximate to a back edge of the carrier surface between the first and second frame sides. The releasable latch member releasably engages the catch member when the carrier surface is in the second position.

17 Claims, 9 Drawing Sheets

(56) References Cited

U.S. PATENT DOCUMENTS

| | | |
|---|---|---|
| 3,681,508 A | 8/1972 | Bohm |
| 3,750,516 A | 8/1973 | Olson |
| 4,122,924 A | 10/1978 | Wasserman |
| 4,331,312 A | 5/1982 | LaVoe |
| 4,380,947 A | 4/1983 | Nishimoto |
| D269,480 S | 6/1983 | Peterson et al. |
| 4,488,468 A | 12/1984 | Peterson et al. |
| 4,545,280 A | 10/1985 | Bisey |
| 4,635,521 A | 1/1987 | Bellini |
| 4,641,565 A | 2/1987 | Tachida et al. |
| 4,656,913 A | 4/1987 | Yoshikawa |
| 4,770,380 A | 9/1988 | Eason et al. |
| 5,031,500 A | 7/1991 | Koike et al. |
| 5,086,686 A | 2/1992 | Misawa et al. |
| 5,149,905 A | 9/1992 | Count |
| 5,243,493 A | 9/1993 | Jeng et al. |
| 5,248,846 A | 9/1993 | Koike et al. |
| 5,312,076 A | 5/1994 | Rogov |
| 5,335,283 A | 8/1994 | Torii |
| 5,396,398 A | 3/1995 | Gill |
| 5,452,951 A | 9/1995 | Peller |
| 5,465,644 A | 11/1995 | Shimoda et al. |
| 5,553,692 A | 9/1996 | Sheiman |
| 5,762,168 A | 6/1998 | Miyoshi |
| 5,789,693 A | 8/1998 | Lawson |
| 5,866,829 A | 2/1999 | Pecoraro |
| 5,929,362 A | 7/1999 | Oteyza |
| 6,020,549 A | 2/2000 | Reimann et al. |
| 6,068,355 A | 5/2000 | Thorp |
| 6,087,574 A | 7/2000 | Kitashima et al. |
| 6,222,729 B1 | 4/2001 | Yoshikawa |
| 6,336,691 B1 | 1/2002 | Maroney et al. |
| 6,349,029 B1 | 2/2002 | Leman et al. |
| 6,371,495 B2 | 4/2002 | Thompson |
| 6,376,759 B1 | 4/2002 | Suzuki |
| 6,399,870 B1 | 6/2002 | Azima et al. |
| 6,501,650 B2 | 12/2002 | Edmunds et al. |
| 6,916,980 B2 | 7/2005 | Ishida et al. |
| 6,929,268 B1 | 8/2005 | Owens |
| 7,060,890 B2 | 6/2006 | Sato et al. |
| 7,078,611 B2 | 7/2006 | Izumi et al. |
| 7,119,269 B2 | 10/2006 | Furuhashi et al. |
| 7,247,788 B2 | 7/2007 | Lai |
| 7,329,812 B2 | 2/2008 | Kuwahara et al. |
| 7,735,941 B2 | 6/2010 | Heathcote |
| 8,800,455 B2 * | 8/2014 | Monroe .................. B62B 3/004 108/15 |
| 2001/0005309 A1 | 6/2001 | Iwasaki |
| 2001/0049995 A1 | 12/2001 | Torii et al. |
| 2003/0196541 A1 | 10/2003 | Ishida et al. |
| 2004/0173086 A1 | 9/2004 | Sato et al. |
| 2004/0206226 A1 | 10/2004 | Negoescu et al. |
| 2005/0066798 A1 | 3/2005 | Naito |
| 2005/0155486 A1 | 7/2005 | Furuhashi |
| 2008/0178778 A1 * | 7/2008 | Koning ................ A47B 3/0818 108/132 |

\* cited by examiner

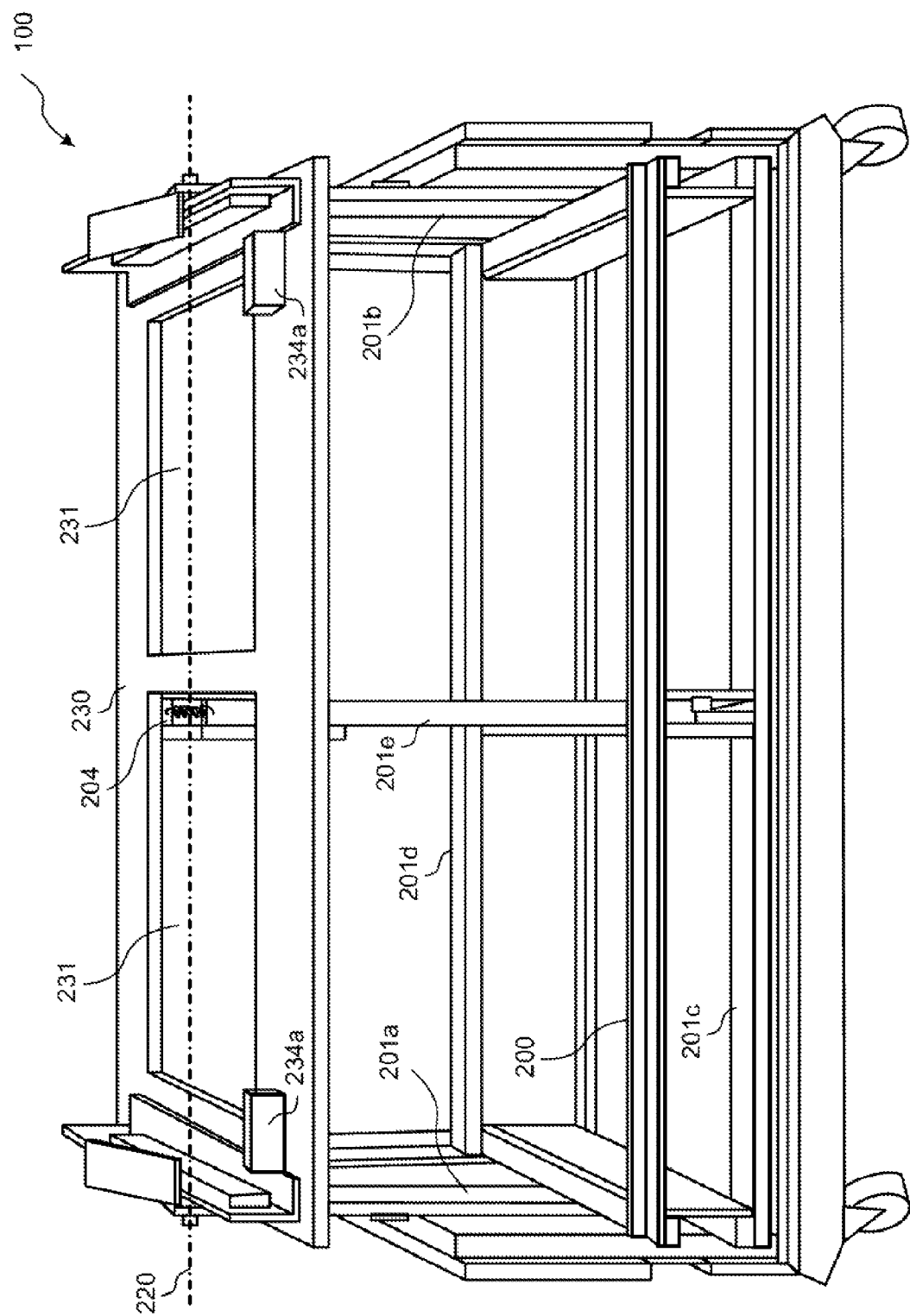

AUDIO MIXING CONSOLE CASE

CROSS-REFERENCE TO RELATED APPLICATION

The present patent application is a continuation patent application of and claims priority to U.S. patent application Ser. No. 13/052,794, filed Mar. 21, 2011, entitled "Audio Mixing Console Case," and invented by Dana Monroe, the disclosure of which is incorporated by reference herein.

BACKGROUND

The subject matter disclosed herein generally relates to equipment shipping cases. More specifically, the subject matter disclosed herein relates to a shipping and/or storage case for an audio mixing console.

BRIEF DESCRIPTION OF THE DRAWINGS

The subject matter disclosed herein is illustrated by way of example and not by limitation in the accompanying figures in which like reference numerals indicate similar elements and in which:

FIG. 2 depicts a front perspective view of the exemplary embodiment of a case with two exterior cover portions removed so that portions of a frame structure and a console carrier are visible according to the subject matter disclosed herein;

DETAILED DESCRIPTION

Figure 1A:
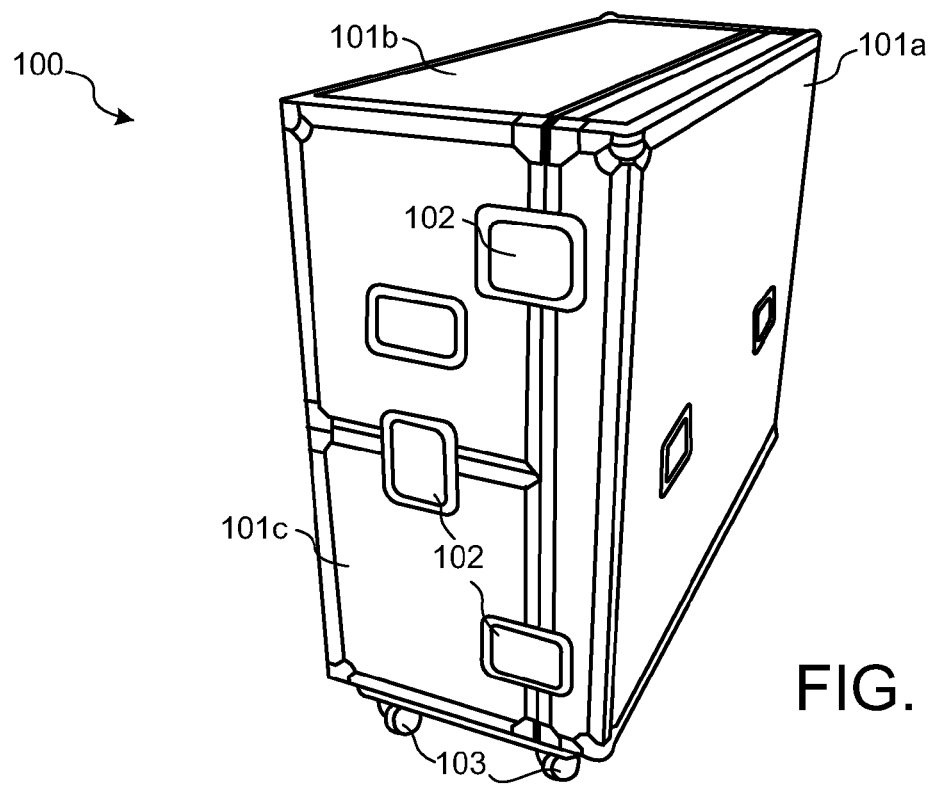
FIGS. 1A-1D respectively depict perspective side views of an exemplary embodiment of an audio mixing console case according to the subject matter disclosed herein.

As used herein, the word "exemplary" means "serving as an example, instance, or illustration." Any embodiment described herein as "exemplary" is not to be construed as necessarily preferred or advantageous over other embodiments. Additionally, it will be appreciated that for simplicity and/or clarity of illustration, elements illustrated in the figures have not necessarily been drawn to scale. For example, the dimensions of some of the elements may be exaggerated relative to other elements for illustrative clarity. Further, in some figures only one or two of a plurality of similar elements indicated by reference characters for illustrative clarity of the figure, whereas all of the similar element may not be indicated by reference characters. Further still, it should be understood that although some portions of components and/or elements of the subject matter disclosed herein have been omitted from the figures for illustrative clarity, good engineering, construction and assembly practices are intended.

FIGS. 1A-1D respectively depict perspective side views of an exemplary embodiment of an audio mixing console case 100 according to the subject matter disclosed herein. In particular, case 100 comprises exterior cover portions 101a-101c that provide shipping and/or storage protection for an audio mixing console internal to case 100. For the exemplary embodiment of mixer case 100 depicted in FIGS. 1A-1C, cover portions 101a and 101b are separately removable to expose an audio mixing console 150. Cover portion 101 c remains in place for the exemplary embodiment depicted. In an alternative exemplary embodiment, each of covers 101a-101c could be separately removable. In yet another alternative exemplary embodiment, a greater or fewer number of cover portions could comprise an audio mixing console case according to the subject matter disclosed herein.

Case 100 comprises sufficient structural integrity for allowing mixing console 150 to be shipped by air, by road or by any conventional technique. Wheels or casters 103, of which only two are depicted in the views of FIGS. 1A-1D, are attached to the bottom of case 100 in a well-known manner for allowing case 100 to be easily moved or rolled into place. In one exemplary embodiment, case 100 includes four wheels 103. It should be understood that alternative exemplary embodiments could comprise more than four wheels 103. Additionally, various drawers and other storage convenience items are depicted herein in the Figures, but not identified. It should be understood that alternative exemplary embodiment could comprise drawers and other storage convenience items in locations that are different from the drawers and storage convenience items depicted herein. Further still, case 100 is not limited to being for an audio mixer console. In other alternative exemplary embodiments, a case according to the subject matter disclosed herein can be used for, but not limited to, a digital sound manipulation device, a professional lighting and dimming console, a musical instrument, computer equipment, etc. Accordingly, it should be understood that while console 150 is described as being an audio mixer console, console 150 could alternatively be, but not limited to, a digital sound manipulation device, a professional lighting and dimming console, a musical instrument, computer equipment, etc.

Figure 1B:
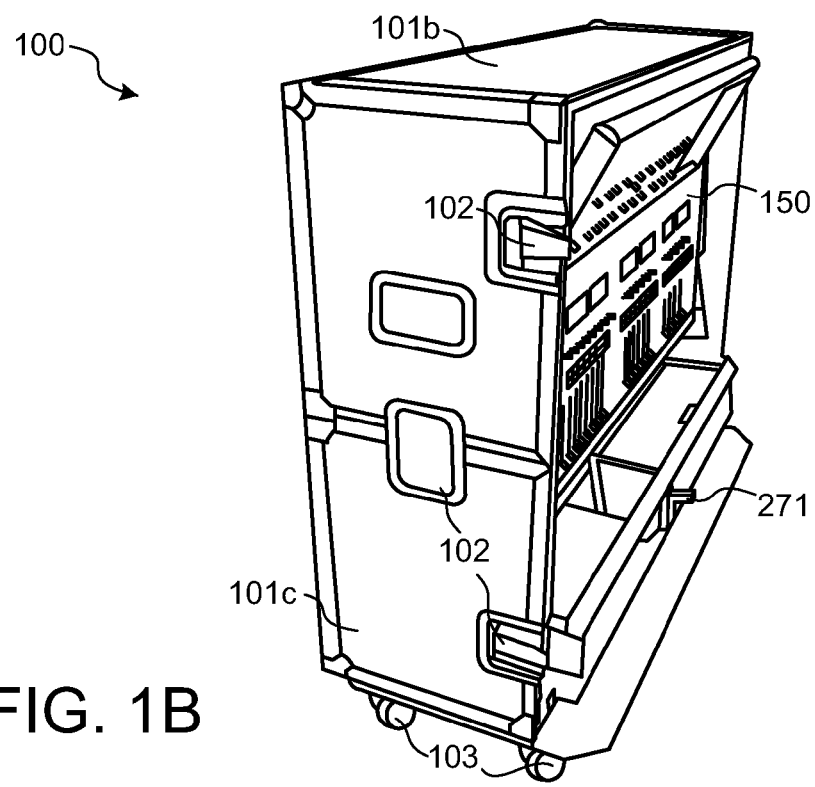
Figure 1C:
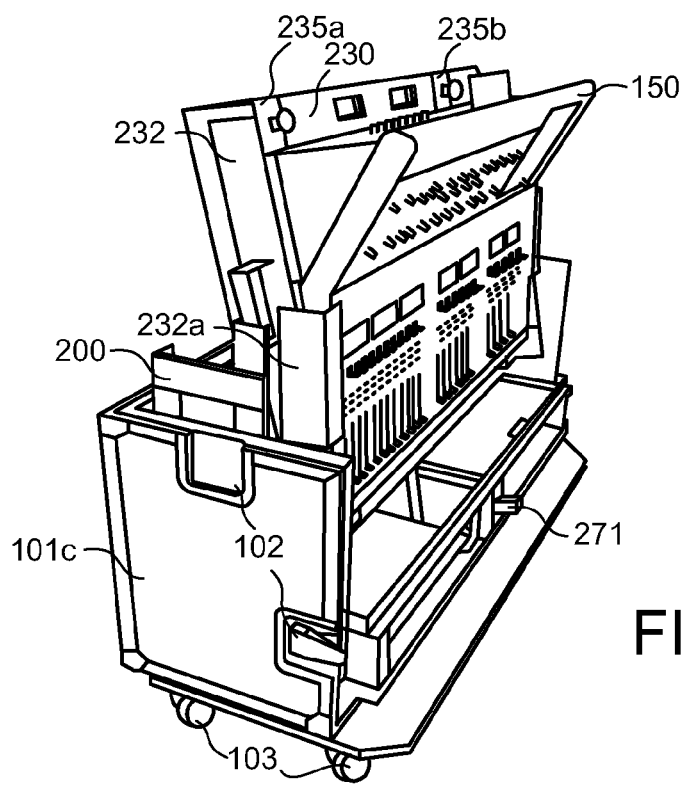
Figure 1D:
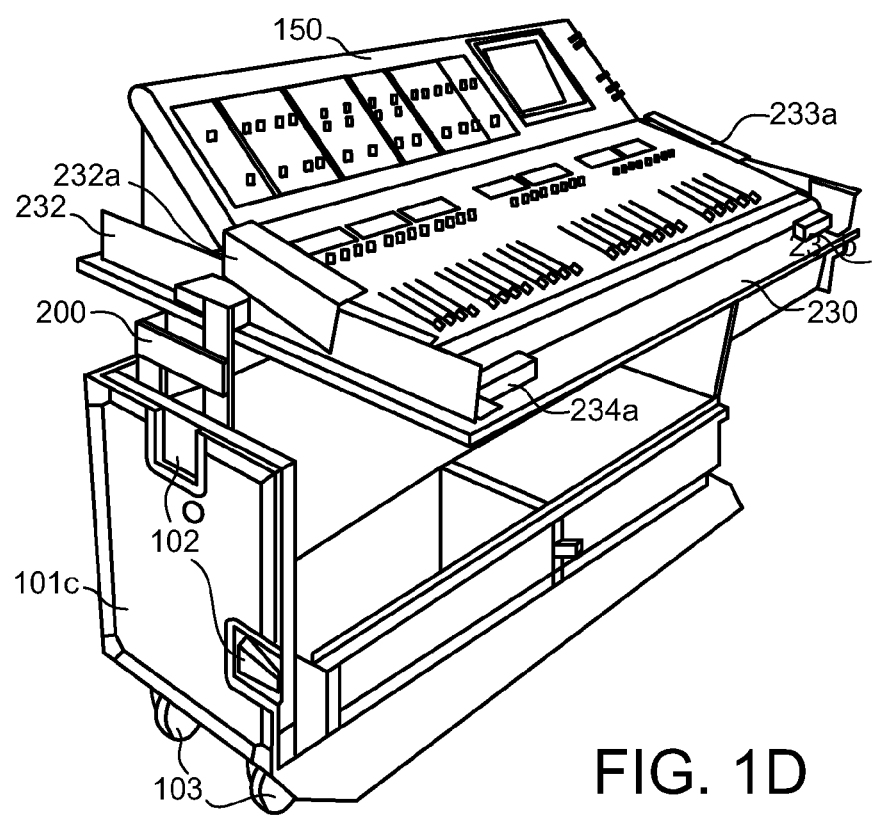

FIG. 1A depicts case 100 completely closed with cover portions 101a and 101b attached to cover portion 101c in a well-known manner, such as by latches 102. It should be understood that details of latches are not depicted in the figures for illustrative clarity of FIGS. 1A-1D. In FIG. 1B, cover portion 101a has been removed, thereby exposing an audio mixing console 150 in a first position that is suitable for transport or for storage. In FIG. 1C, cover portion 101b has been removed, further exposing mixing console 150 in the first, storage position. In FIG. 1D, console 150 has been rotated to a second position, operational position that is suitable for using or operating mixing console 150.

In use, case 100 with a mixing console 150 inside is transported or shipped between an initial location and a destination location by air, by road or by any conventional technique. At the destination location, case 100 is rolled into place and cover portions 101a and 101b are unlatched and removed, thereby permitting mixing console 150 to be rotated from the first, storage position (FIG. 1C) to the second, operational position (FIG. 1D). Appropriate electrical connections are made to the mixing console in the second, operational position, and the mixing console is operated. When operation of the mixing console is completed, the electrical connections are disconnected and mixing console 150 is rotated back to the first, storage position. Cover portions 101a and 101b are replaced and latched into position, and case 100 is then ready for further transporting or shipping.

Case 100 also comprises a frame structure 200 that provides structural support for a console carrier 230 that holds mixing console 150 and provides structural support for exterior cover portions 101a-101c. FIG. 2 depicts a front perspective view of the exemplary embodiment of case 100 with exterior cover portions 101a and 101b removed so that portions of frame structure 200 and console carrier 230 are visible. Console carrier 230 is depicted in the second, operational position in FIG. 2, and without a mixer console 150 mounted on console carrier 230.

One exemplary embodiment of frame structure 200 comprises a left-side frame portion 201a, a right-side frame portion 201b, a front frame portion 201c, a back frame portion 201d and a center frame portion 201e. Front frame portion 201c and back frame portion 201d extend between left-side frame portion 201a and right-side frame portion 201b. Center frame portion 201e extends between from frame portion 201c and back frame portion 201d. The exemplary embodiments of the various frame portions 201a-201e of frame structure 200 depicted in the figures may each respectively comprise a plurality of elongated members that together form a cage-like frame structure for frame structure 200. For example, in FIG. 3, right-side frame portion 201b is depicted as comprising a first frame member 202a and a second frame member 202b coupled together at the top of first and second frame members 202a and 202b in a well-known manner by a third frame member 203. Another frame member (not shown) couples first and second frame members 202a and 202b together in a well-known manner at the bottom of first and second frame members 202a and 202b. Other portions of frame structure 200 are configured similar to first and second frame members 202a and 202b in depicted in FIG. 3. The exemplary embodiment of frame structure 200 is attached in a well-known manner to case portion 101c.

It should be understood that each respective frame portion 201a-201e of frame structure 200 is for simplicity referred to as a frame portion for illustrative simplicity even though an actual frame portion may comprise a plurality of elongated members that together form a cage-like frame structure. While the exemplary embodiments of frame portions 201a-201e are depicted as comprising one or more elongated members that together form a cage-like frame structure, it should also be understood that a particular frame portion could alternatively be embodied as, but not limited to, a panel or as a panel comprising one or more openings that provide weight reduction for the panel. That is, the frame structure of the subject matter disclosed herein is not limited by the exemplary depiction disclosed herein.

Frame portions 201a-201e are fastened to each other in a well-known manner, such as by, but not limited to, nuts and bolts. Further, while an exemplary number of elongated members of the respective frame portions are depicted in the figures, it should be understood that the subject matter disclosed herein is not so limited.

Console carrier 230 is rotatably coupled in a well-known manner to the left-side frame portion 201 and the right-side frame portion 202. Console carrier 230 rotates around an axis of rotation 220 between the first, storage position and the second, operational position. The position of axis of rotation 220 with respect to console carrier 230 is selected so that when a mixer console is mounted on console carrier 230, the mixer console and console carrier 230 are substantially balanced with respect to axis of rotation 220, thereby reducing the force that a user applies to console carrier 230 when rotating console carrier 230 between the first, storage position and the second, operational position. In an alternative exemplary embodiment, the position of axis of rotation 220 with respect to console carrier 230 could be selected so that when a mixer console is mounted on console carrier 230, the mixer console and console carrier 230 are not necessarily substantially balanced with respect to axis of rotation 220, thereby requiring a greater amount of force that a user applies to console carrier 230 when rotating console carrier 230 between the first, storage position and the second, operational position.

In one exemplary embodiment, console carrier 230 comprises cut outs or apertures 231 that reduce the overall weight of console carrier 230 and/or to provide a surface that can be easily gripped when rotating console carrier 230. In another exemplary embodiment, console carrier 230 comprises a continuous surface having no cut outs or apertures. It should be understood that either exemplary embodiment of console carrier 230 does not limit the subject matter disclosed herein.

Figure 3:
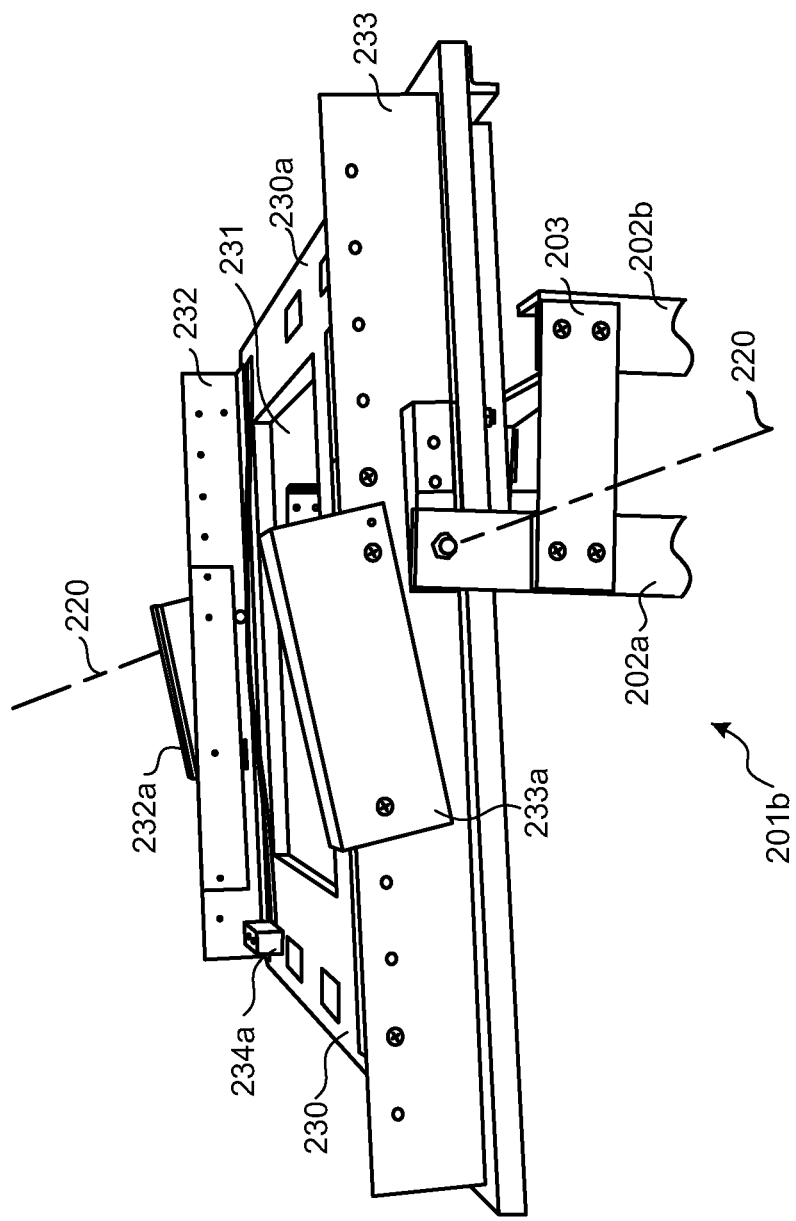
FIG. 3 depicts a right-side perspective view of a portion of a frame structure and console carrier in an operational position according to the subject matter disclosed herein.

FIG. 3 depicts a right-side perspective view of an exemplary embodiment of a console carrier 230 in the second, operational position. Console carrier 230 comprises a left-side mounting bracket 232 and a right-side mounting bracket 233 that are attached to the front (i.e., top) surface 230a of console carrier 230 in a well-known manner. Brackets 232 and 233 are spaced apart from each other a distance that accommodates a particular audio mixer console to fit between brackets 232 and 233. (See, for example, FIGS. 1C and 1D.) Brackets 232 and 233 each respectively comprise a holding bracket portion 232a and 233a that captively holds an audio mixer console to console carrier 230 and keeps the audio mixer console from falling forward away from console carrier 230 when console carrier 230 is in the first, storage position. (See FIGS. 1B and 1C.) Holding bracket portions 232a and 233a are configured to hold a particular audio mixer console. In one exemplary embodiment, holding bracket portions 232a and 233a are respectively attached to brackets 232 and 233 using a well-known manner, such as by, but not limited to, nuts and bolts. In another exemplary embodiment, holding bracket portions 232a and 233a are respectively integrally formed with brackets 232 and 233. It should also be understood that the particular configurations of holding bracket portions 232a and 233a are not limited to the exemplary embodiments of holding bracket portions 232a and 233a depicted in the figures. Additionally, it should be understood that an exemplary alternative embodiment comprises brackets 232 and 233 and/or bracket portions 232a and 233a that are adjustable to accommodate different models of audio mixer consoles.

Console carrier 230 also comprises stop members 234a and 234b located towards a front end of console carrier 230. Stop members 234a and 234b are attached to console carrier 230 in a well-known manner, such as by, but not limited to, nuts and bolts. Stop members 234a and 234b provide a mechanical stop for an audio mixer console mounted on console carrier 230. To mount an audio mixer console on console carrier 230, the mixer console is slid into place on console carrier 230 from the rear of console carrier 230 until the front edge of the mixer console contacts stop members 234a and 234b. Once the mixer console is in place against stop members 234a and 234b, stop members 235a and 235b (FIG. 1C) are attached to console carrier 230 in a well-known manner, such as by, but not limited to, hand-tightened fasteners. In an alternative exemplary embodiment, stop members 235a and 235b could be embodied as a single stop member. It should also be understood that stop members 234a and 234b could be embodied as a single stop member and/or could be integrally formed as part of carrier console 230.

Figure 4A:
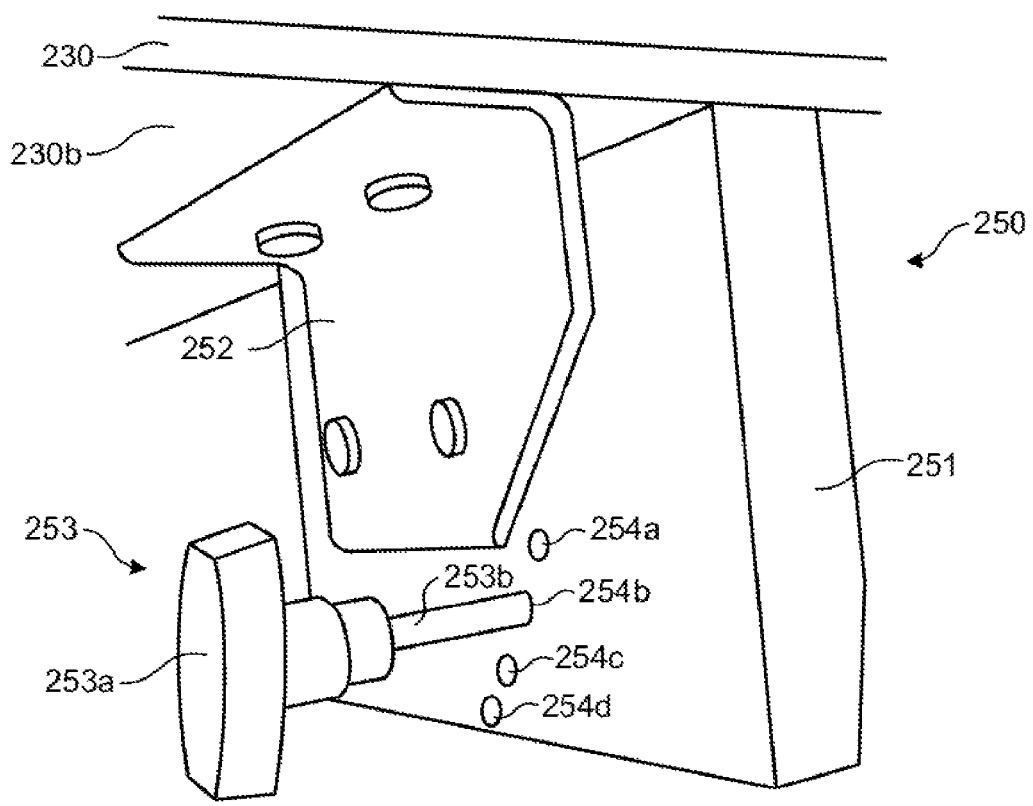
FIGS. 4A and 4B respectively depict a side perspective view and a front perspective view of a catch member assembly that is attached to a rear bottom surface of a console carrier according to the subject matter disclosed herein.
Figure 4B:
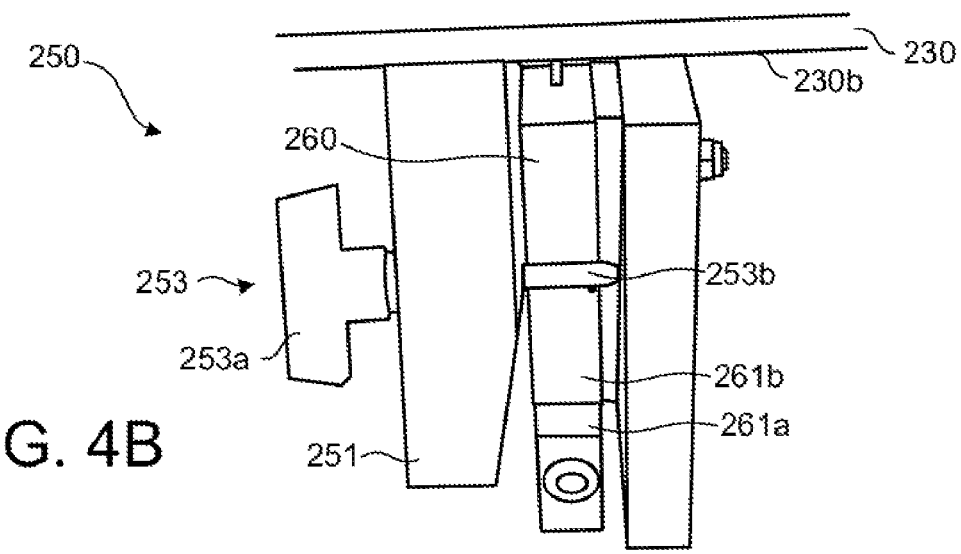

FIGS. 4A and 4B respectively depict a side perspective view and a front perspective view of a catch member assembly 250 that is attached to the rear bottom surface 230b of console carrier 230. Catch member assembly 250 comprises a frame member 251, a mounting bracket 252 and a catch member 253. Mounting bracket 252 attaches frame member 251 to the bottom of console carrier 230 in a well-known manner, such as by, but not limited to, nuts and bolts. Catch member 253 comprises a handgrip portion 253a and a catch portion 253b. As depicted in FIG. 4A, catch portion 253b of catch member 253 is partially inserted into one of a plurality of apertures 254a-254d for illustrative clarity. That is, catch portion 253b is depicted as being partially inserted into aperture 254b for illustrative clarity. As depicted in FIG. 4B, catch portion 253b is completely inserted into the aperture. A user can select which aperture 254a-254d catch member 253 is inserted into in order to position console carrier 230 at a convenient angle during operation. For example, by inserting catch member 253 into aperture 254a, console carrier 230 is positioned in much more horizontal second, operational position than if catch member 253 is inserted into aperture 254d. In one exemplary embodiment, apertures 254a-254d are arranged substantially along an arc having a center of curvature that coincides with axis 220.

Figure 5A:
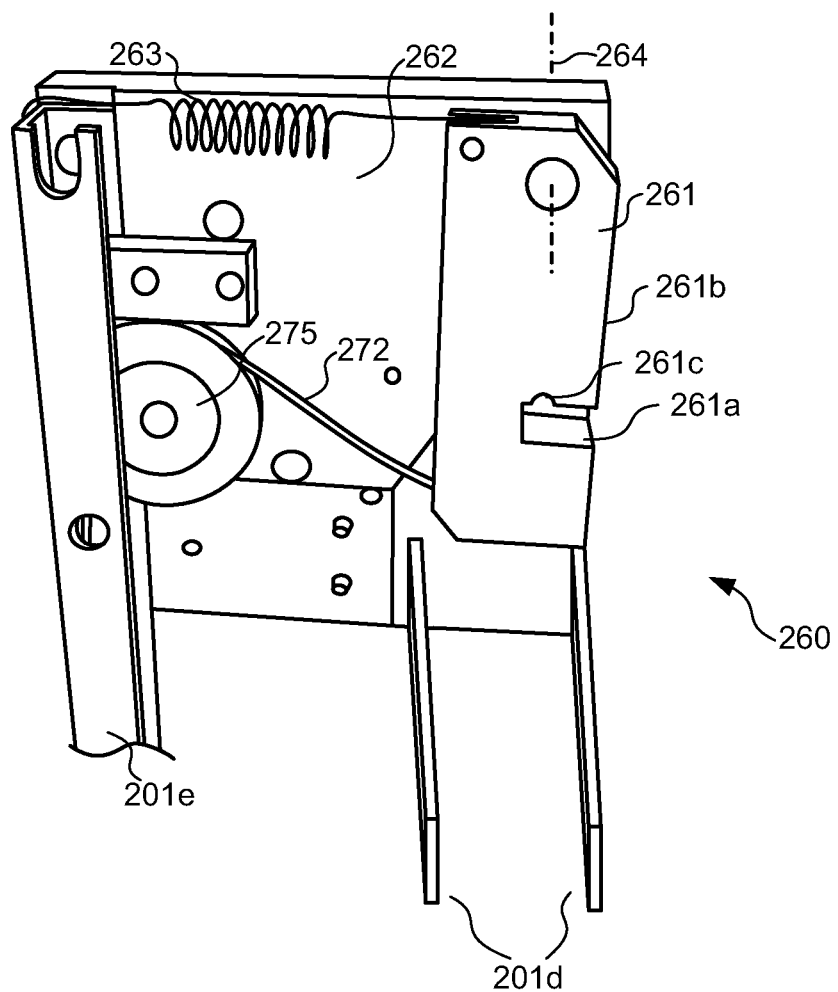
FIG. 5A depicts a side perspective view of a releasable member assembly in which a releasable member is in a first position according to the subject matter disclosed herein.
Figure 5B:
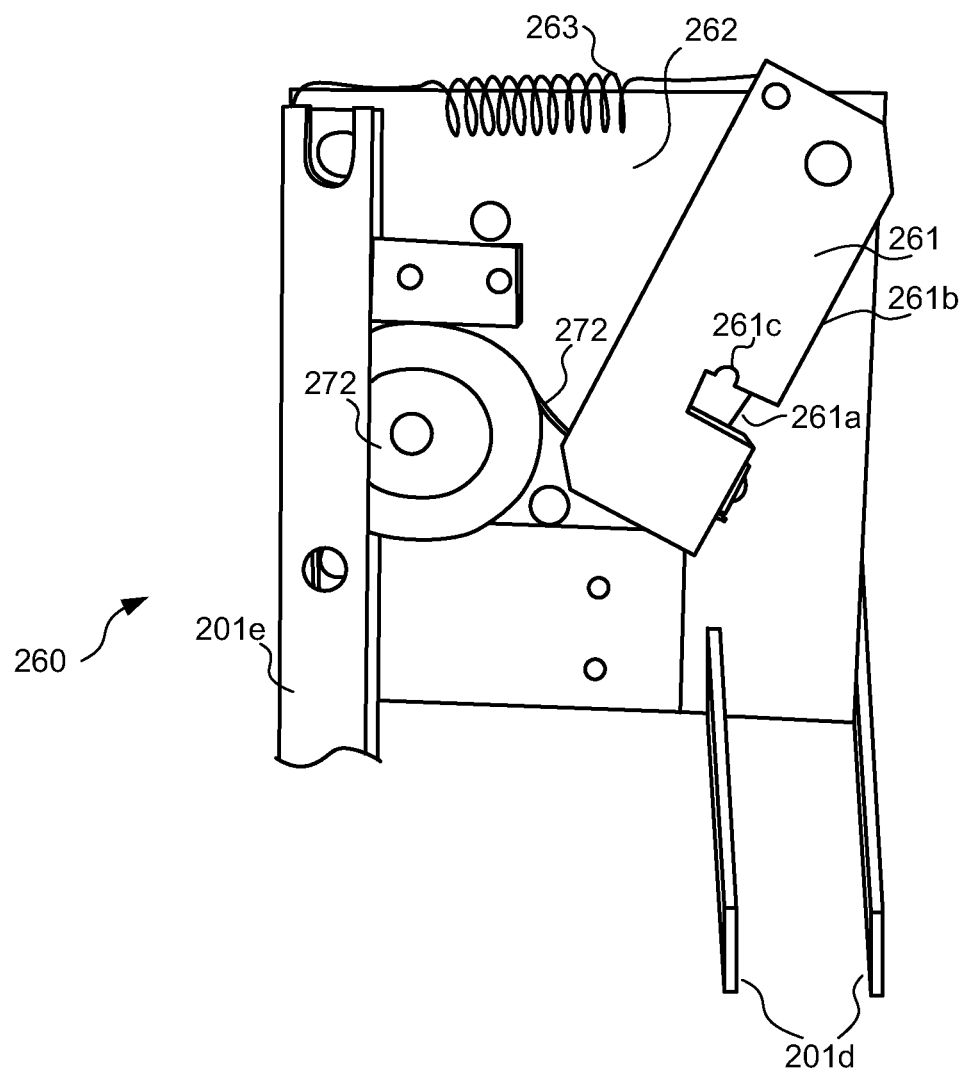
FIG. 5B depicts a side perspective view of the releasable member assembly in which the releasable member is in a second position according to the subject matter disclosed herein.

FIG. 5A depicts a side perspective view of a releasable member assembly 260 in which a releasable member 261 is in a first position. FIG. 5B depicts a side perspective view of releasable member assembly 260 in which releasable member 261 is in a second position. Releasable member assembly 260 comprises releasable member 261, a mounting member 262 and a spring member 263. Releasable member 261 is rotatably coupled to mounting member 262 in a well-known manner so that releasable member 261 rotates about an axis of rotation 264 (FIG. 5A). Mounting member 262 is rigidly attached to frame structure 200 in a well-known manner toward the back of frame structure 200. A portion of frame structure 201e is depicted in FIGS. 5A and 5B. In one exemplary embodiment, releasable member assembly 260 is located at the top rear of frame structure 200, as indicated by 204 in FIG. 2, so that catch member assembly 250, which is attached to the rear bottom side of console carrier 230, and releasable member assembly 260 operatively and releasably engage.

Releasable member 261 comprises a slot 261a that is adapted to receive catch portion 253b of catch member 253. Spring member 263 is coupled to releasable member 261 and frame structure 201 e in a well-known manner. Spring member 263 provides a force that causes releasable member 261 to rotate counter-clockwise around axis of rotation 264 (as viewed in FIGS. 5A and 5B) to the first position of releasable member 261 depicted in FIG. 5A.

As console carrier 230 is rotated into the second, operational position (FIG. 1D) from the first, storage position (FIG. 1C), catch portion 253b of catch member 253 comes into contact with surface 261b of releasable member 261 and begins to move along surface 26 lb toward slot 261a. As this happens, releasable member 261 rotates clockwise around axis of rotation 264 (as viewed in FIGS. 5A and 5B) toward the second position of releasable member 261 depicted in FIG. 5B. As console carrier 230 moves from the first, storage position to the second, operational position, catch portion 253b moves in an arc having a radius that is a function of the distance of catch 253b from axis of rotation 220. As releasable member 261 rotates around axis of rotation 264, slot 261 a moves in an arc that is a function of the distance of slot 261 a from axis of rotation 264. When catch portion 253b and slot 261a coincide, catch portion 253b enters slot 261a, and spring member 263 causes releasable member 261 to rotate back to the first position of releasable member 261 (FIG. 5A). Console carrier 230 is then releasably held in the second, operational position. In one exemplary embodiment, slot 261a comprises a second slot 261c formed in slot 261a that provides a more affirmative-feeling latch mechanism than a slot 261a without such a slot 261c.

Figure 6:
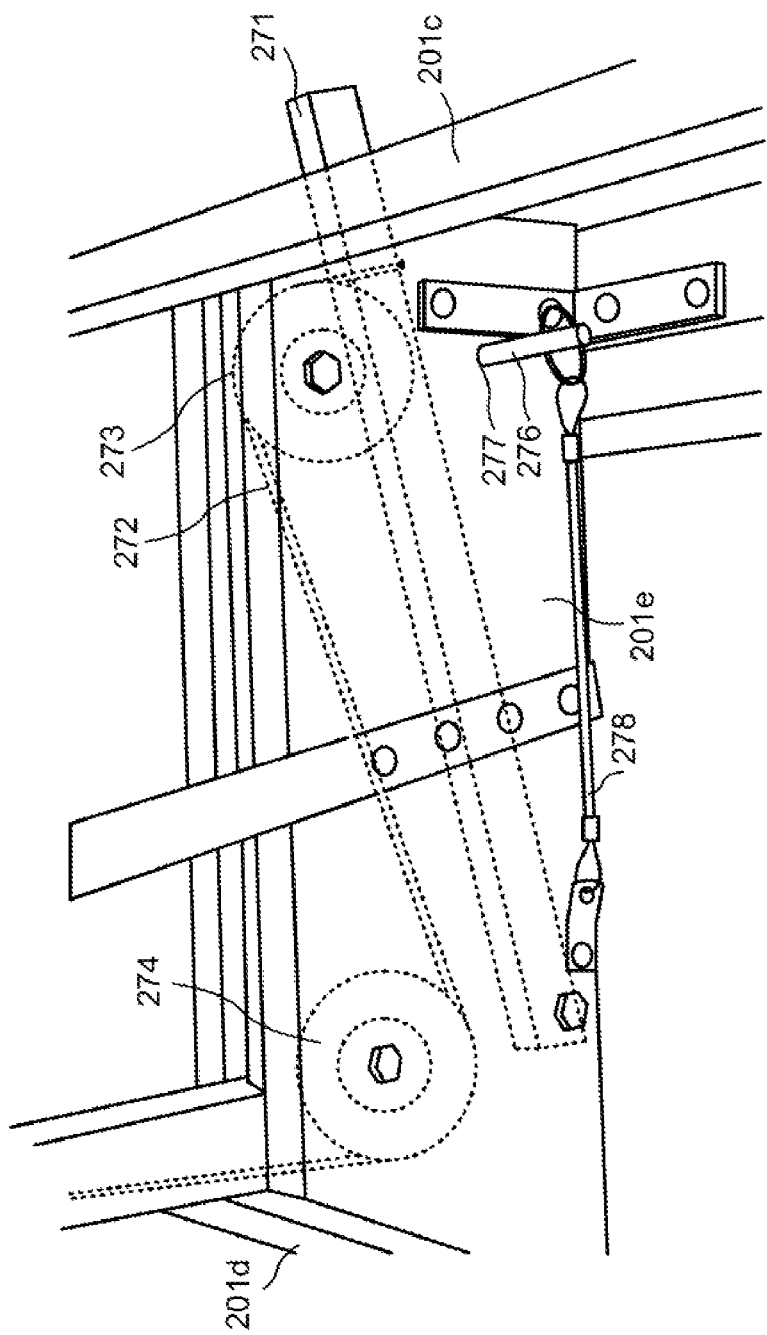
FIG. 6 depicts a cut-away view of a mechanism for unlocking a console carrier from the operational position according to the subject matter disclosed herein.

When console carrier 230 is to be rotated back to the first, storage position, a lever member 271, depicted in FIG. 6, is actuated, thereby pulling on cable member 272 and rotating releasable member 261 clockwise (as viewed in FIGS. 5A and 5B) and disengaging slot 261a from catch 253b so that console carrier 230 can be rotated back to the first, storage position. A stop member 205 (FIG. 2) coupled to frame structure 200 in a well-known manner stops console carrier from rotating beyond the first, storage position. Cable member 272 is coupled to each of lever member 271 and releasable member 261 in a well-known manner. Cable member 272 extends between lever member 271 and releasable member 261 and is wound around sheaves 273, 274 and 275. It should be understood that the path of cable member 272 depicted in the figures is an exemplary path and could be configured differently. A locking pin member 276 is inserted into an aperture 277 so that locking pin member 276 extends through center frame portion 201 e and prevents lever member 271 from unwanted actuation. Locking pin member 276 is captively held in a well-known manner by tether member 278.

Figure 7:
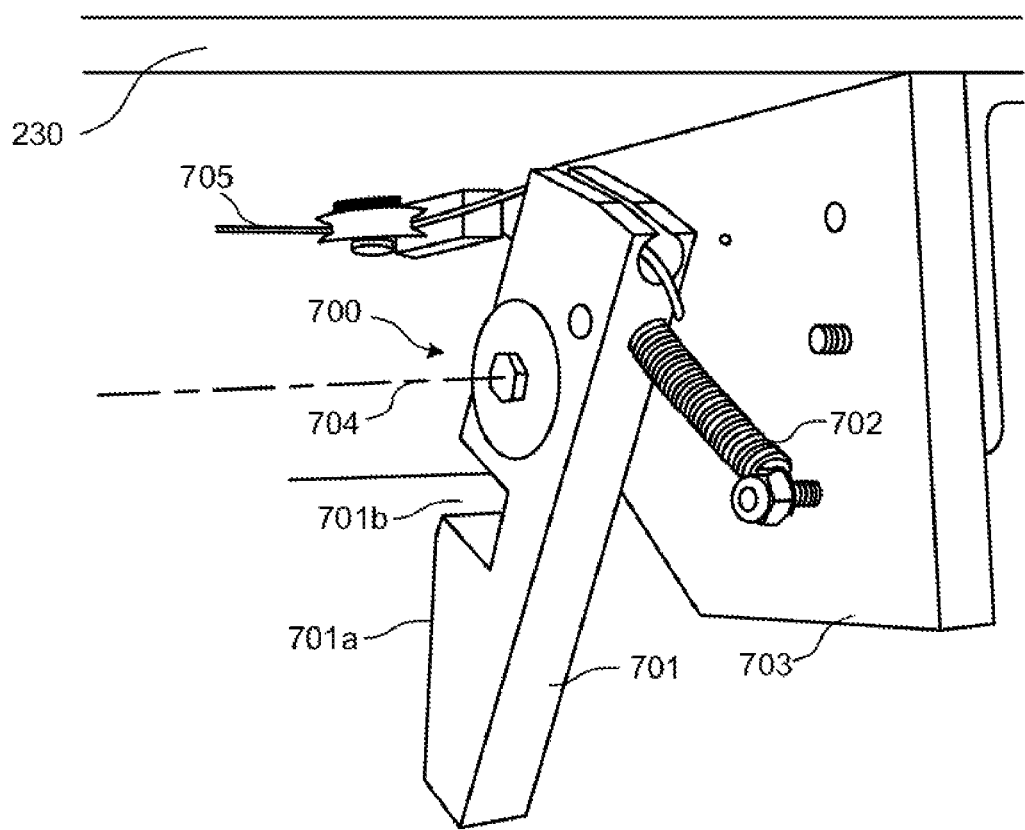
FIG. 7 depicts a perspective view of an exemplary alternative mechanism for releasably locking a console carrier into the operational position according to the subject matter disclosed herein.

FIG. 7 depicts a perspective view of an exemplary alternative mechanism 700 for releasably locking console carrier 230 into the second, operational position. Mechanism 700 comprises a releasable member 701 and a spring member 702. Releasable member 701 is rotatably coupled to a mounting plate 703 in a well-known manner so that releasable member rotates around an axis of rotation 704. Spring member 702 biases releasable member 701 in a clockwise direction, as viewed in FIG. 7. As console carrier 230 is rotated from the first, storage position to the second, operational position, a surface 701 a on the far side of releasable member 701, as viewed in FIG. 7, comes into contact with a catch member (not shown) that is fixedly coupled to frame structure 200. Surface 701a slides along the fixed catch member until the catch member aligns with a slot 701b in releasable member 701. Because releasable member 701 is coupled to console carrier 230, releasable member 701 is traveling in an arc as console carrier 230 rotates into the second, operational position. The fixed catch member causes releasable member 701 to rotate about axis 704 as console carrier 230 rotates into the second, operational position, thereby compensating for the arcuate path taken by slot 70 lb. Once the fixed catch member is in slot 701b, console carrier 230 is held in the second, operational position until a cable member 705 pulls releasable member 701 counter-clockwise (as viewed in FIG. 7), thereby releasing releasable member 701 from the fixed catch member. Cable member 705 is coupled to releasable member 701 and a lever member (not shown) in a well-known manner. In one exemplary embodiment, axis of rotation 704 is substantially parallel to axis of rotation 220 (FIG. 2). In another exemplary embodiment, axis of rotation 704 is not substantially parallel to axis of rotation 220.

Although the foregoing disclosed subject matter has been described in some detail for purposes of clarity of understanding, it will be apparent that certain changes and modifications may be practiced that are within the scope of the appended claims. Accordingly, the present embodiments are to be considered as illustrative and not restrictive, and the subject matter disclosed herein is not to be limited to the details given herein, but may be modified within the scope and equivalents of the appended claims.

What is claimed is:

1. A case, comprising:
    a first frame member comprising a first end and a second end;
    a second frame member comprising a first end and a second end, the first and second frame members being spaced apart from each other;
    a third frame member comprising a first end and a second end;
    a fourth frame member comprising a first end and a second end, the third and fourth frame members being spaced apart from each other;
    a fifth frame member coupled between the first end of the first frame member and the first end of the third frame member; and
    a sixth frame member coupled between the first end of the second frame member and the first end of the fourth frame member;
    a carrier comprising a front edge, a back edge, a first side, a second side, a top surface, a bottom surface and a catch member, the first side being proximate to the first frame member and the second side being proximate to the second frame member, the carrier being pivotally coupled to the first and second frame members along a first axis of rotation and rotatable in a first direction with respect to the first axis of rotation between a first substantially vertical position and a second generally horizontal position and rotatable in a second direction with respect to the first axis of rotation between the second generally horizontal position and the first substantially vertical position, and the catch member being located on the bottom surface proximate to the back edge of the carrier between the first and second frame members;
    a cover comprising a removable cover part and a part fixably coupled to the first and second frame members, the removable cover part being removable to provide access to the carrier; and
    a release mechanism comprising a releasable latch member, a lever member, a cable member and at least two sheaves, the release mechanism being actuated to release the releasable latch member from the catch member, the lever member comprising a fulcrum end and a second end distal to the fulcrum end, a first end of the cable member being coupled to the lever member proximate to the second end of the lever member, a second end of the cable member being coupled to the releasable latch member, and the cable member being wound around each sheave between the first end and the second end of the cable member.

2. The case according to claim 1, further comprising:
    a seventh frame member comprising first, second, third and fourth sides, the first side being opposite the second side and the third side being opposite the fourth side, the first side of the seventh frame member being coupled to the first and third frame members distal to the first ends of the first and third frame members, and the second side of the seventh frame member being coupled to the second and fourth frame members distal to the first ends of the second and fourth frame members.

3. The case according to claim 1, further comprising a bracket mechanism coupled to the top surface of the carrier, the bracket mechanism being capable of receiving and coupling a console to the top surface of the carrier.

4. The case according to claim 3, further comprising the console coupled to the top surface of the carrier by the bracket mechanism, the console and the carrier being substantially balanced with respect to the first axis of rotation, a bottom surface of the console remaining substantially parallel to the top surface of the carrier as the carrier rotates with respect to the first axis of rotation between the first substantially vertical position and the second generally horizontal position.

5. The case according to claim 1, wherein the console comprises an audio mixer console.

6. The case according to claim 1, wherein the console comprises a lighting and dimming console.

7. The case according to claim 1, wherein the console comprises computer equipment.

8. A case, comprising:
    a first frame member comprising a first end and a second end;
    a second frame member comprising a first end and a second end, the first and second frame members being spaced apart from each other;
    a third frame member comprising a first end and a second end;
    a fourth frame member comprising a first end and a second end, the third and fourth frame members being spaced apart from each other;
    a fifth frame member coupled between the first end of the first frame member and the first end of the third frame member; and
    a sixth frame member coupled between the first end of the second frame member and the first end of the fourth frame member;
    a carrier comprising a front edge, a back edge, a first side, a second side, a top surface, a bottom surface and a catch member, the first side being proximate to the first frame member and the second side being proximate to the second frame member, the carrier being pivotally coupled to the first and second frame members along a first axis of rotation and rotatable in a first direction with respect to the first axis of rotation between a first substantially vertical position and a second generally horizontal position and rotatable in a second direction with respect to the first axis of rotation between the second generally horizontal position and the first substantially vertical position, and the catch member being located on the bottom surface proximate to the back edge of the carrier between the first and second frame members;
    a cover comprising a removable cover part and a part fixably coupled to the first and second frame members, the removable cover part being removable to provide access to the carrier;

a release mechanism comprising a releasable latch member, the release mechanism being actuated to release the releasable latch member from the catch member;

a bracket mechanism coupled to the top surface of the carrier, the bracket mechanism being capable of receiving and coupling a console to the top surface of the carrier; and the console coupled to the top surface of the carrier by the bracket mechanism, the console and the carrier being substantially balanced with respect to the first axis of rotation, a bottom surface of the console remaining substantially parallel to the top surface of the carrier as the carrier rotates with respect to the first axis of rotation between the first substantially vertical position and the second generally horizontal position.

9. The case according to claim 8, wherein the release mechanism further comprises a lever member and a cable member, the lever member comprising a fulcrum end and a second end distal to the fulcrum end, the first end of the cable member being coupled to the lever member proximate to the second end of the lever member, and the second end of the cable member being coupled to the releasable latch member.

10. The case according to claim 9, wherein the release mechanism further comprises at least two sheaves, and
wherein the cable member further is wound around each sheave between the first end and the second end of the cable member.

11. The case according to claim 8, wherein the console comprises an audio mixer console.

12. The case according to claim 8, wherein the console comprises a lighting and dimming console.

13. The case according to claim 8, wherein the console comprises computer equipment.

14. A case, comprising:
a first frame member comprising a first end and a second end;

a second frame member comprising a first end and a second end, the first and second frame members being spaced apart from each other;

a carrier comprising a front edge, a back edge, a first side, and a second side, the first side being proximate to the first frame member and the second side being proximate to the second frame member, the carrier being pivotally coupled to the first and second frame members along a first axis of rotation and rotatable in a first direction with respect to the first axis of rotation between a first substantially vertical position and a second generally horizontal position and rotatable in a second direction with respect to the first axis of rotation between the second generally horizontal position and the first substantially vertical position; and a cover comprising a removable cover part and a part fixably coupled to the first and second frame members, the removable cover part being removable to provide access to the carrier;

a bracket mechanism coupled to the top surface of the carrier, the bracket mechanism being capable of receiving and coupling a console to the top surface of the carrier; and the console being coupled to the top surface of the carrier by the bracket mechanism, a bottom surface of the console remaining substantially parallel to the top surface of the carrier as the carrier rotates with respect to the first axis of rotation between the first substantially vertical position and the second generally horizontal position, the console and the carrier being substantially balanced with respect to the first axis of rotation.

15. The case according to claim 14, wherein the console comprises an audio mixer console.

16. The case according to claim 14, wherein the console comprises a lighting and dimming console.

17. The case according to claim 14, wherein the console comprises computer equipment.

* * * * *